United States Patent
Chiu et al.

(10) Patent No.: US 12,009,341 B2
(45) Date of Patent: Jun. 11, 2024

(54) INTEGRATED ANTENNA PACKAGE STRUCTURE

(71) Applicant: Industrial Technology Research Institute, Hsinchu (TW)

(72) Inventors: Po-Kai Chiu, Taoyuan (TW); Sheng-Tsai Wu, Taoyuan (TW); Yu-Min Lin, Hsinchu County (TW); Wen-Hung Liu, Taichung (TW); Ang-Ying Lin, Tainan (TW); Chang-Sheng Chen, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 251 days.

(21) Appl. No.: 17/564,197

(22) Filed: Dec. 28, 2021

(65) Prior Publication Data
US 2023/0197680 A1    Jun. 22, 2023

(30) Foreign Application Priority Data
Dec. 17, 2021 (TW) .................................. 110147388

(51) Int. Cl.
*H01L 31/0203* (2014.01)
*H01L 23/00* (2006.01)
(Continued)

(52) U.S. Cl.
CPC ...... *H01L 25/0652* (2013.01); *H01L 23/3107* (2013.01); *H01L 23/367* (2013.01);
(Continued)

(58) Field of Classification Search
CPC .............................. H01L 23/66; H01L 23/367; H01L 2223/6677
(Continued)

(56) References Cited

U.S. PATENT DOCUMENTS 11,004,809 B2    5/2021   Chiang et al.
11,646,498 B2 *  5/2023   Roth ...................... H01L 21/56
                                                          257/728
(Continued)

FOREIGN PATENT DOCUMENTS

| CN | 111508947 | 8/2020 |
|---|---|---|
| TW | I695472 | 6/2020 |
| WO | 2019167436 | 9/2019 |

OTHER PUBLICATIONS

Office Action of Taiwan Counterpart Application, dated May 26, 2022, pp. 1-5.

*Primary Examiner* — Nitin Parekh
(74) *Attorney, Agent, or Firm* — JCIPRNET

(57) ABSTRACT

An integrated antenna package structure includes a first redistribution structure, a first chip, a heat dissipation structure, a second chip, and an antenna structure. The first chip is located on a first side of the first redistribution structure, and is electrically connected to the first redistribution structure. The heat dissipation structure is thermally connected to the first chip, and the first chip is located between the heat dissipation structure and the first redistribution structure. The second chip is located on a second side of the first redistribution structure opposite to the first side, and is electrically connected to the first redistribution structure. The antenna structure is electrically connected to the first redistribution structure.

18 Claims, 14 Drawing Sheets

(51) Int. Cl.
  *H01L 23/31*     (2006.01)
  *H01L 23/367*    (2006.01)
  *H01L 23/498*    (2006.01)
  *H01L 23/66*     (2006.01)
  *H01L 25/065*    (2023.01)

(52) U.S. Cl.
  CPC .. *H01L 23/49811* (2013.01); *H01L 23/49822* (2013.01); *H01L 23/66* (2013.01); *H01L 24/16* (2013.01); *H01L 2223/6677* (2013.01); *H01L 2224/16227* (2013.01)

(58) Field of Classification Search
  USPC .......................................................... 257/433
  See application file for complete search history.

(56) References Cited

U.S. PATENT DOCUMENTS

| | | |
|---|---|---|
| 2009/0322643 A1 | 12/2009 | Choudhury |
| 2019/0355680 A1* | 11/2019 | Chuang ............... H01L 23/5389 |
| 2020/0075515 A1 | 3/2020 | Chen et al. |
| 2020/0118971 A1 | 4/2020 | Tang et al. |
| 2020/0251414 A1 | 8/2020 | Hsu et al. |
| 2020/0302003 A1* | 9/2020 | Kerr ..................... H04L 63/1441 |
| 2021/0035930 A1* | 2/2021 | Chi ......................... H01L 24/20 |
| 2021/0098860 A1* | 4/2021 | Kuo ........................ H01L 21/568 |
| 2021/0398924 A1* | 12/2021 | You .................... H01L 23/49833 |
| 2022/0209391 A1* | 6/2022 | Tang ................... H01L 23/4334 |
| 2023/0061876 A1* | 3/2023 | Tsai ........................ H01L 23/13 |

* cited by examiner

INTEGRATED ANTENNA PACKAGE STRUCTURE

CROSS-REFERENCE TO RELATED APPLICATION

This application claims the priority benefit of Taiwan application serial no. 110147388, filed on Dec. 17, 2021. The entirety of the above-mentioned patent application is hereby incorporated by reference herein and made a part of this specification.

TECHNICAL FIELD

The disclosure relates to an integrated antenna package structure.

BACKGROUND

With the advent of the 5G communication era, related technologies of millimeter wave, beam forming, and antenna arrays have become the trend of future development. Small cells may be applied to 5G communications, and may increase data capacity, data transmission speed, and overall network efficiency, so the communication quality may be effectively improved. In order to improve the performance of the small cells, how to improve the performance of antennas has become an important issue.

A phased array antenna includes multiple antenna units, and the antenna units are driven by a chip. However, due to the limitation of the package structure of the existing chip, the heat generated by the chip is difficult to be dissipated, which also affects the performance of the antenna unit. Therefore, how to provide a package structure that may effectively improve the heat dissipation of the chip has become an urgent issue.

SUMMARY

At least one embodiment of the disclosure provides an integrated antenna package structure, including a first redistribution structure, a first chip, a heat dissipation structure, a second chip, and an antenna structure. The first chip is located on a first side of the first redistribution structure, and is electrically connected to the first redistribution structure. The heat dissipation structure is thermally connected to the first chip, and the first chip is located between the heat dissipation structure and the first redistribution structure. The second chip is located on a second side of the first redistribution structure opposite to the first side, and is electrically connected to the first redistribution structure. The antenna structure is electrically connected to the first redistribution structure.

At least one embodiment of the disclosure provides an integrated antenna package structure, including a first chip, a second chip, a first redistribution structure, a first package layer, a heat dissipation structure, and an antenna structure. The first redistribution structure is located between the first chip and the second chip. The first package layer surrounds the first chip. The heat dissipation structure is located under the first chip and the first package layer, and is thermally connected to the first chip. The antenna structure is electrically connected to the first redistribution structure.

DETAILED DESCRIPTION OF DISCLOSED EMBODIMENTS

Figure 1:
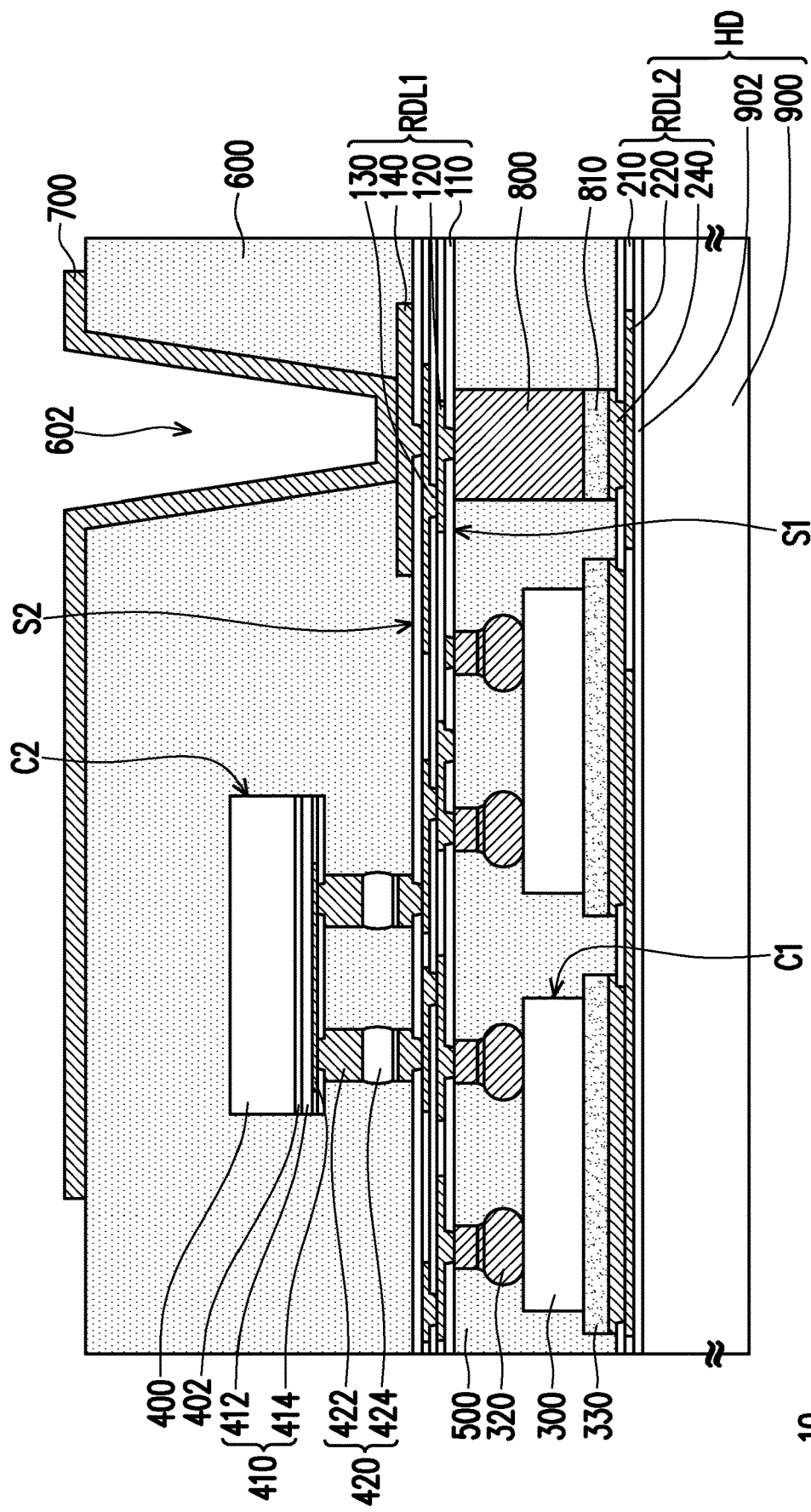
FIG. 1 is a schematic cross-sectional view of an integrated antenna package structure according to an embodiment of the disclosure.

FIG. 1 is a schematic cross-sectional view of an integrated antenna package structure according to an embodiment of the disclosure.

Referring to FIG. 1, an integrated antenna package structure 10 includes a first redistribution structure RDL1, a first chip C1, a heat dissipation structure HD, a second chip C2, and an antenna structure 700. In this embodiment, the integrated antenna package structure 10 further includes a first package layer 500, a second package layer 600, and a conductive pillar 800.

The first redistribution structure RDL1 has a first side S1 and a second side S2 opposite to the first side S1. The first redistribution structure RDL1 includes at least one first conductive layer and at least one first insulating layer overlapping the first conductive layer. In this embodiment, the first redistribution structure RDL1 includes multiple first conductive layers 120 and 140, and multiple first insulating layers 110. The adjacent first conductive layers 120 and 140 are electrically connected to each other through a first conductive hole 130. In this embodiment, the first side S1 of the first redistribution structure RDL1 has the first conductive holes 130, and the second side S2 of the first redistribution structure RDL1 has the first conductive layer 140. The first conductive layer 140 is the topmost conductive layer of the first redistribution structure RDL1.

In some embodiments, a thickness of the first insulating layer 110 ranges between 0.5 μm and 20 μm. In some embodiments, a thickness of the first conductive layer 120 ranges between 0.5 μm and 20 μm. In some embodiments, a thickness of the topmost first conductive layer 140 is greater than or equal to the thickness of other first conductive layers 120, but the disclosure is not limited thereto.

The first chip C1 is located on the first side S1 of the first redistribution structure RDL1, and is electrically connected to the first redistribution structure RDL1. In some embodiments, the first chips C1 are located on the first side S1 of the first redistribution structure RDL1, and each is electrically connected to the first redistribution structure RDL1. In this embodiment, the first chip C1 includes a first semiconductor structure 300, multiple first connecting terminals 320, and at least one first connecting structure 330. The first connecting terminal 320 is located on an active surface of the first semiconductor structure 300, and electrically connects the first semiconductor structure 300 to the first redistribution structure RDL1. In some embodiments, the redistribution structure (not shown) is further included between the first connecting terminal 320 and the first semiconductor structure 300.

In some embodiments, the first connecting terminal 320 is a single-layer or multi-layer structure. In some embodiments, the first connecting terminal 320 includes a bump or other suitable conductive connecting structures. A shape of the first connecting terminal 320 may be adjusted according to actual requirements. In some embodiments, a material of the first connecting terminal 320 includes gold, tin, copper, an alloy of the foregoing materials, or other suitable conductive materials. The first connecting structure 330 is disposed on a side of the first semiconductor structure 300 opposite to the first connecting terminal 320. The first connecting structure 330 is, for example, a thermal interface material, a solder layer, or other suitable materials, and the solder layer is, for example, AuSn solder or other suitable solder.

In some embodiments, a thickness of the first semiconductor structure 300 ranges between 25 μm and 800 μm. In some embodiments, a thickness of the first connecting terminal 320 ranges between 10 μm and 30 μm. In some embodiments, a method of forming the first connecting terminal 320 includes stud bumping, and a wire diameter of an upper narrow part of the first connecting terminal 320 ranges between 10 μm and 30 μm. In some embodiments, a thickness of the first connecting structure 330 ranges between 10 μm and 100 μm.

The conductive pillar 800 is disposed on the first side S1 of the first redistribution structure RDL1, and is electrically connected to the first redistribution structure RDL1. In this embodiment, the conductive pillar 800 is located in the first package layer 500, and the conductive pillar 800 is a through molding via (TMV). In some embodiments, a material of the conductive pillar 800 includes gold, tin, copper, an alloy of the foregoing materials, or other suitable conductive materials. In some embodiments, a diameter of the conductive pillar 800 ranges between 50 μm and 2000 μm.

The second chip C2 is located on the second side S2 of the first redistribution structure RDL1, and is electrically connected to the first redistribution structure RDL1. In some embodiments, the second chips C2 are located on the second side S2 of the first redistribution structure RDL1, and each is electrically connected to the first redistribution structure RDL1. In this embodiment, the second chip C2 includes a second semiconductor structure 400, a redistribution structure 410, and multiple second connecting terminals 420. The second connecting terminal 420 is located on an active surface of the second semiconductor structure 400, and the redistribution structure 410 is disposed between the second connecting terminal 420 and the second semiconductor structure 400. In some embodiments, a surface of the second semiconductor structure 400 is provided with a buffer layer 402, and the redistribution structure 410 is disposed on the buffer layer 402. The redistribution structure 410 includes, for example, at least one insulating layer 412 and at least one conductive layer 414 stacked on each other. The second connecting terminal 420 electrically connects the second semiconductor structure 400 to the first redistribution structure RDL1. The first connecting terminal 320 and the second connecting terminal 420 are respectively connected to the first side S1 and the second side S2 of the first redistribution structure RDL1.

In some embodiments, the second connecting terminal 420 is a single-layer or multi-layer structure. In some embodiments, the second connecting terminal 420 includes a pillar bump 422 and a solder 424. A shape of the second connecting terminal 420 may be adjusted according to the actual requirements. In some embodiments, a material of the pillar bump 422 includes gold, tin, copper, an alloy of the foregoing materials, or other suitable conductive materials.

In this embodiment, the first redistribution structure RDL1 is located between the first chip C1 and the second chip C2, and the first chip C1 and the second chip C2 are respectively located on the first side S1 and the second side S2 of the first redistribution structure RDL1. Therefore, the circuit layout space of the integrated antenna package structure 10 may be used more effectively, so that the integrated antenna package structure 10 may integrate a larger number of chips. In this embodiment, active surfaces of the first chip C1 and the second chip C2 both face the first redistribution structure RDL1, but the disclosure is not limited thereto. In other embodiments, the active surface of the first chip C1 faces the first redistribution structure RDL1, and the active surface of the second chip C2 faces away from the first redistribution structure RDL1.

The first package layer 500 and the second package layer 600 are respectively located on the first side S1 and the second side S2 of the first redistribution structure RDL1. The first package layer 500 and the second package layer 600 may be any suitable package material. For example, the first package layer 500 and the second package layer 600 are epoxy molding compounds (EMCs), resins, or other suitable materials. In some embodiments, a filling material may be further disposed in the first package layer 500 and the second package layer 600, but the disclosure is not limited thereto.

The first package layer 500 surrounds the first chip C1 and the conductive pillar 800. In this embodiment, in addition to covering a side surface of the first chip C1, the first package layer 500 is further located between the first chip C1 and the first redistribution structure RDL1, and covers the first connecting terminal 320 of the first chip C1.

The second package layer 600 surrounds the second chip C2. In this embodiment, in addition to covering a side surface of the second chip C2, the second package layer 600 is further located between the second chip C2 and the first redistribution structure RDL1, and covers the second connecting terminal 420 of the second chip C2.

In some embodiments, a thickness of the first package layer 500 ranges between 100 μm and 150 μm. In some embodiments, a thickness of the second package layer 600 ranges between 200 μm and 800 μm.

The heat dissipation structure HD is located under the first chip C1, and is thermally connected to the first chip C1. The first chip C1 is located between the heat dissipation structure HD and the first redistribution structure RDL1. In some embodiments, when the integrated antenna package structure 10 is operating, the first chip C1 emits more heat than the second chip C2. Therefore, the heat dissipation structure HD thermally connected to the first chip C1 may effectively improve the heat dissipation efficiency of the integrated antenna package structure 10. In some embodiments, the first chip C1 is, for example, a power amplifier, and the second chip C2 is, for example, a switch.

In this embodiment, the heat dissipation structure HD includes a second redistribution structure RDL2 and a heat dissipation substrate 900. The first chip C1 is located between the second redistribution structure RDL2 and the first redistribution structure RDL1. The heat dissipation substrate 900 is thermally connected to the second redistribution structure RDL2, and the first chip C1 is thermally connected to the heat dissipation substrate 900 through the second redistribution structure RDL2.

In some embodiments, the heat dissipation substrate 900 includes a semiconductor (such as silicon) or metal. In some embodiments, a buffer layer 902 is sandwiched between the heat dissipation substrate 900 and the second redistribution structure RDL2. The buffer layer 902 is, for example, silicon oxide, silicon nitride, or other suitable materials. In some embodiments, an outer surface of the heat dissipation substrate 900 may be provided with a heat dissipation structure, such as a heat dissipation fin, a water-cooling device, or other suitable heat dissipation structures.

The second redistribution structure RDL2 includes at least one second conductive layer and at least one second insulating layer overlapping the second conductive layer. In this embodiment, the second redistribution structure RDL2 includes multiple second conductive layers 220 and 240, and multiple second insulating layers 210. In some embodiments, the second conductive layer 240 is the topmost conductive layer of the second redistribution structure RDL2. In some embodiments, the second conductive layer 240 is an under bump metallurgy (UBM). In some embodiments, the first chip C1 and the conductive pillar 800 are electrically connected to the second redistribution structure RDL2 through the first connecting structure 330 and a connecting structure 810, respectively, and the conductive pillar 800 electrically connects the second redistribution structure RDL2 to the first redistribution structure RDL1.

In some embodiments, a thickness of the second insulating layer 210 ranges between 0.5 μm and 20 μm. In some embodiments, a thickness of the second conductive layer 220 ranges between 0.5 μm and 20 μm. In some embodiments, a thickness of the topmost second conductive layer 240 is greater than or equal to the thickness of other second conductive layers 220, but the disclosure is not limited thereto. In some embodiments, the thickness of the topmost second conductive layer 240 ranges between 0.5 μm and 20 μm.

The antenna structure 700 is electrically connected to the first redistribution structure RDL1. In this embodiment, the antenna structure 700 is located on the second side S2 of the first redistribution structure RDL1, and is connected to the first conductive layer 140 of the first redistribution structure RDL1. In this embodiment, the antenna structure 700 is formed on the second package layer 600, and is electrically connected to the first redistribution structure RDL1 through a conductive via 602 in the second package layer 600. In some embodiments, the antenna structure 700 is further electrically connected to the second redistribution structure RDL2 through the conductive pillar 800. A feed line of the antenna structure 700 is disposed in the first redistribution structure RDL1 and/or the second redistribution structure RDL2. In some embodiments, a diameter of the conductive via 602 ranges between 100 μm to 2000 μm, and the conductive via 602 is disposed on a pad in the first conductive layer 140.

In some embodiments, the antenna structure 700 may be any form of antenna. For example, the antenna structure 700 is an antenna array including multiple antenna units, a printed inverted-F antenna (PIFA), or other antenna structures. Each of the antenna units is electrically connected to the first redistribution structure RDL1. In some embodiments, the antenna structure 700 is suitable for end-fire or broadside antennas, and is configured to be at a frequency between 26 GHz and 33 GHz where a return loss is less than 10 dB.

In some embodiments, analysis results of a heat transfer simulation of the integrated antenna package structure 10 are shown in Table 1 below.

TABLE 1

| Heat dissipation conditions (WK/mm2) | Ta (° C.) | H (W) | Tj (° C.) | Tc (° C.) | Rjc (° C./W) | Rja (° C./W) |
|---|---|---|---|---|---|---|
| 5000 | 25 | 10 | 94.39 | 61.22 | 3.314 | 6.93 |
| 10000 | 25 | 10 | 83.79 | 50.57 | 3.319 | 5.87 |

In Table 1, heat dissipation conditions are the heat dissipation conditions under the heat dissipation structure HD. Ta is an ambient temperature. H is the heat released by the first chip C1. Tj is a highest temperature of a heating position of the first chip C1. Tc is an average temperature at a bottom of the heat dissipation structure HD. Rjc is (Tj−Tc)/H, and Rja is (Tj−Ta)/H.

It may be seen from Table 1 that the integrated antenna package structure 10 has an advantage of high heat dissipation efficiency.

In some embodiments, a pad (not shown) may be further disposed on the second package layer 600, and the pad is, for example, formed on the same film layer as the antenna structure 700. The pad is electrically connected to the first redistribution structure RDL1, and is adapted to be connected to other circuit boards.

Figure 2:
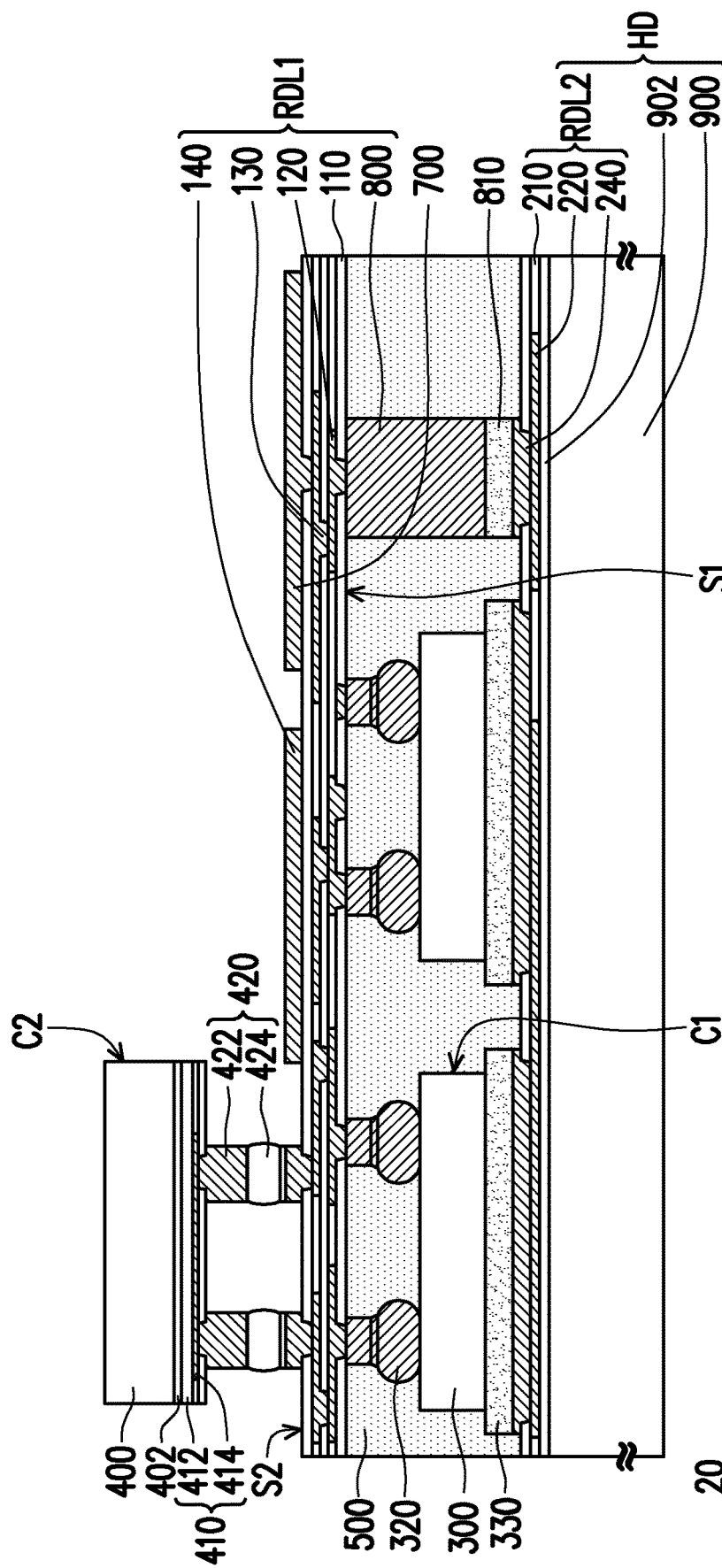
FIG. 2 is a schematic cross-sectional view of an integrated antenna package structure according to an embodiment of the disclosure.

FIG. 2 is a schematic cross-sectional view of an integrated antenna package structure according to an embodiment of the disclosure. It is noted that some of the reference numerals and descriptions of the embodiment of FIG. 1 will apply to the embodiment of FIG. 2. The same reference numerals will represent the same or similar components, and the descriptions of the same technical contents will be omitted. Reference may be made to the above embodiment for the omitted descriptions, which will not be repeated in the following.

Referring to FIG. 2, an integrated antenna package structure 20 includes the first redistribution structure RDL1, the first chip C1, the heat dissipation structure HD, the second chip C2, and the antenna structure 700. In this embodiment, the integrated antenna package structure 20 further includes the first package layer 500 and the conductive pillar 800.

In this embodiment, the first redistribution structure RDL1 is located between the first chip C1 and the second chip C2, and the first chip C1 and the second chip C2 are respectively located on the first side S1 and the second side S2 of the first redistribution structure RDL1. Therefore, the circuit layout space of the integrated antenna package structure 20 may be used more effectively, so that the integrated antenna package structure 20 may integrate a larger number of chips.

The heat dissipation structure HD is located under the first chip C1, and is thermally connected to the first chip C1. The first chip C1 is located between the heat dissipation structure HD and the first redistribution structure RDL1. In some embodiments, when the integrated antenna package structure 20 is operating, the first chip C1 emits more heat than the second chip C2. Therefore, the heat dissipation structure HD thermally connected to the first chip C1 may effectively improve the heat dissipation efficiency of the integrated antenna package structure 20.

In some embodiments, the second side S2 of the first redistribution structure RDL1 is not provided with a package layer, and the antenna structure 700 is directly formed on the first redistribution structure RDL1. A top surface of the antenna structure 700 is closer to the first redistribution structure RDL1 than a top surface of the second chip C2. In some embodiments, the antenna structure 700 and the topmost first conductive layer 140 of the first redistribution structure RDL1 belong to the same film layer, thereby saving the cost required for manufacturing the antenna structure 700.

Figure 3:
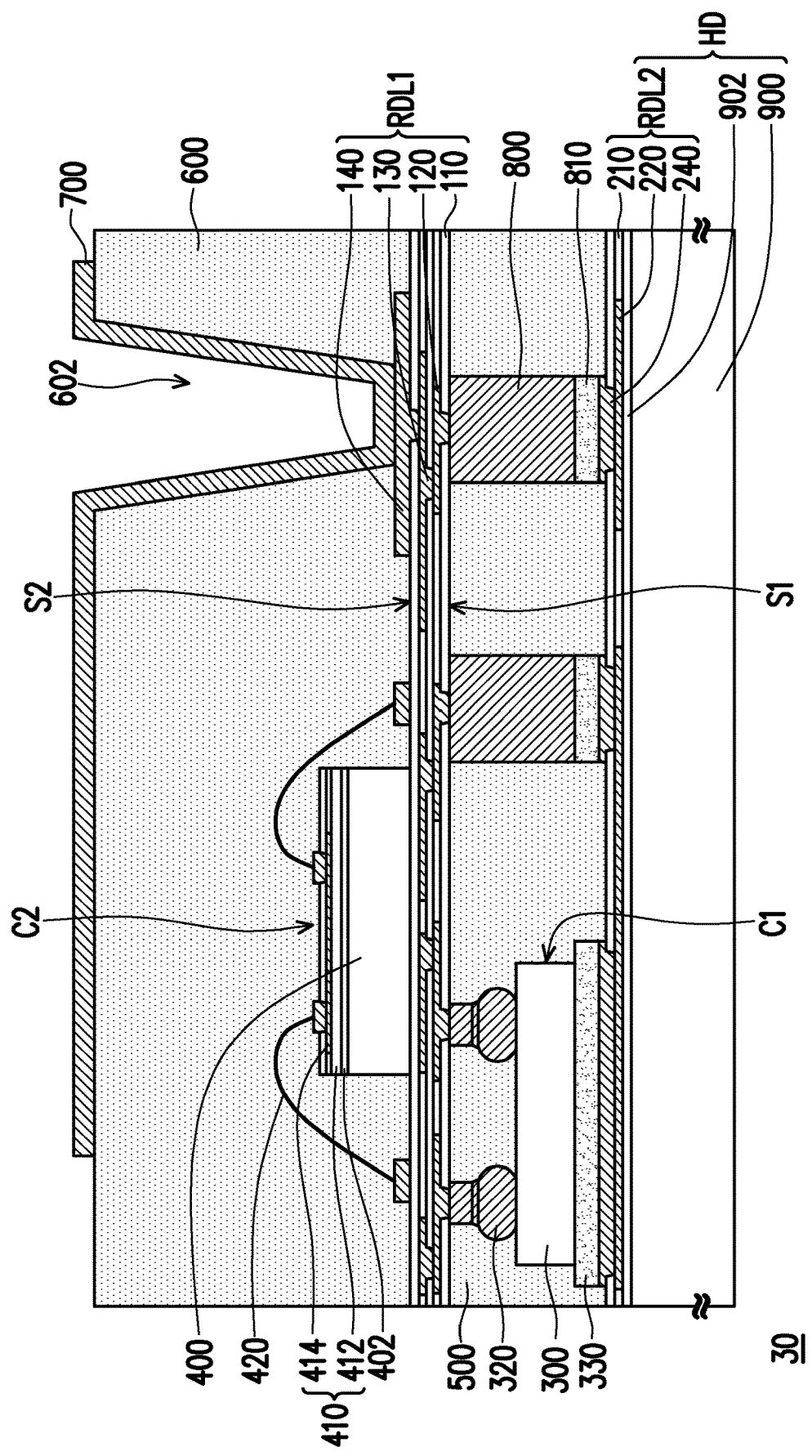
FIG. 3 is a schematic cross-sectional view of an integrated antenna package structure according to an embodiment of the disclosure.

FIG. 3 is a schematic cross-sectional view of an integrated antenna package structure according to an embodiment of the disclosure. It is noted that some of the reference numerals and descriptions of the embodiment of FIG. 1 will apply to the embodiment of FIG. 3. The same reference numerals will represent the same or similar components, and the descriptions of the same technical contents will be omitted. Reference may be made to the above embodiment for the omitted descriptions, which will not be repeated in the following.

Referring to FIG. 3, an integrated antenna package structure 30 includes the first redistribution structure RDL1, the first chip C1, the heat dissipation structure HD, the second chip C2, and the antenna structure 700. In this embodiment, the integrated antenna package structure 30 further includes the first package layer 500, the second package layer 600, and the conductive pillar 800.

In this embodiment, the first redistribution structure RDL1 is located between the first chip C1 and the second chip C2, and the first chip C1 and the second chip C2 are respectively located on the first side S1 and the second side S2 of the first redistribution structure RDL1. Therefore, the circuit layout space of the integrated antenna package structure 30 may be used more effectively, so that the integrated antenna package structure 30 may integrate a larger number of chips. In this embodiment, the active surface of the first chip C1 faces the first redistribution structure RDL1, and the active surface of the second chip C2 faces away from the first redistribution structure RDL1.

The heat dissipation structure HD is located under the first chip C1, and is thermally connected to the first chip C1. The first chip C1 is located between the heat dissipation structure HD and the first redistribution structure RDL1. In some embodiments, when the integrated antenna package structure 30 is operating, the first chip C1 emits more heat than the second chip C2. Therefore, the heat dissipation structure HD thermally connected to the first chip C1 may effectively improve the heat dissipation efficiency of the integrated antenna package structure 30.

In this embodiment, the second chip C2 is electrically connected to the first conductive layer 140 of the first redistribution structure RDL1 by wire bonding, and the second connecting terminal 420 of the second chip C2 is a metal wire.

Figure 4:
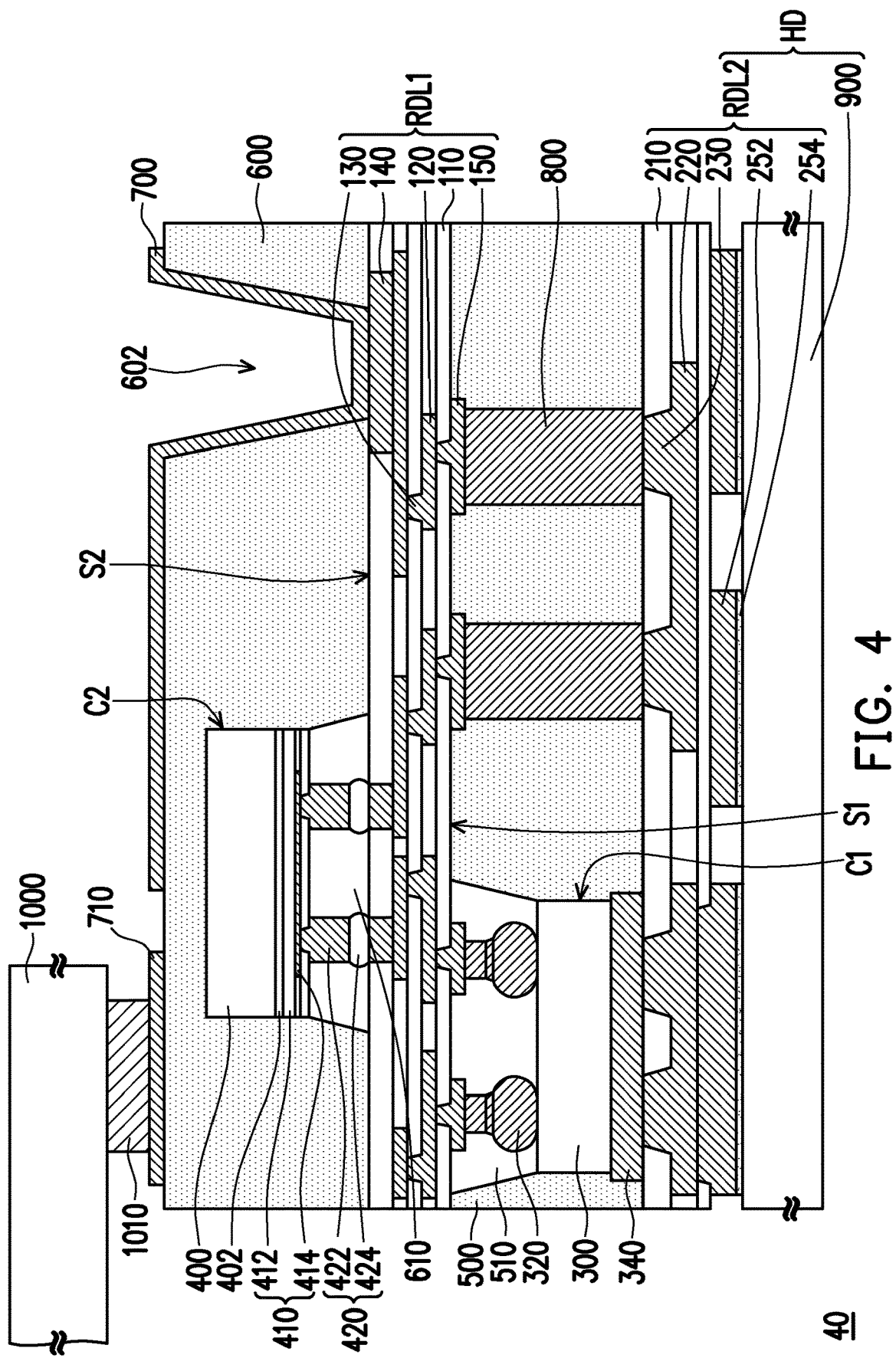
FIG. 4 is a schematic cross-sectional view of an integrated antenna package structure according to an embodiment of the disclosure.

FIG. 4 is a schematic cross-sectional view of an integrated antenna package structure according to an embodiment of the disclosure. It is noted that some of the reference numerals and descriptions of the embodiment of FIG. 1 will apply to the embodiment of FIG. 4. The same reference numerals will represent the same or similar components, and the descriptions of the same technical contents will be omitted. Reference may be made to the above embodiment for the omitted descriptions, which will not be repeated in the following.

Referring to FIG. 4, an integrated antenna package structure 40 includes the first redistribution structure RDL1, the first chip C1, the heat dissipation structure HD, the second chip C2, and the antenna structure 700. In this embodiment, the integrated antenna package structure 40 further includes a first underfill material 510, a second underfill material 610, the first package layer 500, the second package layer 600, the conductive pillar 800, a pad 710, and a circuit board 1000.

In this embodiment, the first redistribution structure RDL1 is located between the first chip C1 and the second chip C2, and the first chip C1 and the second chip C2 are respectively located on the first side S1 and the second side S2 of the first redistribution structure RDL1. Therefore, the circuit layout space of the integrated antenna package structure 40 may be used more effectively, so that the integrated antenna package structure 40 may integrate a larger number of chips. In this embodiment, the topmost first conductive layer 140 of the first redistribution structure RDL1 is connected to the second chip C2, and a bottommost first conductive layer 150 of the first redistribution structure RDL1 is connected to the first chip C1.

In this embodiment, the first underfill material 510 is filled between the first chip C1 and the first redistribution structure RDL1, and surrounds the first connecting terminal 320 of the first chip C1. The first package layer 500 surrounds the first chip C1 and the first underfill material 510.

The second underfill material 610 is filled between the second chip C2 and the first redistribution structure RDL1, and surrounds the second connecting terminal 420 of the second chip C2. The second package layer 600 surrounds the second chip C2 and the second underfill material 610.

The heat dissipation structure HD is located under the first chip C1, and is thermally connected to the first chip C1. The first chip C1 is located between the heat dissipation structure HD and the first redistribution structure RDL1. In some embodiments, when the integrated antenna package structure 40 is operating, the first chip C1 emits more heat than the second chip C2. Therefore, the heat dissipation structure HD thermally connected to the first chip C1 may effectively improve the heat dissipation efficiency of the integrated antenna package structure 40.

In this embodiment, the first chip C1 further includes a heat dissipation material layer 340. The heat dissipation material layer 340 is located on the side of the first semiconductor structure 300 opposite to the first connecting terminal 320, and the heat dissipation material layer 340 of the first chip C1 is thermally connected to the heat dissipation structure HD. In some embodiments, the heat dissipation material layer 340 includes a thermal interface material, metal, or other thermally conductive materials.

In some embodiments, the heat dissipation structure HD includes the second redistribution structure RDL2 and the heat dissipation substrate 900, but the disclosure is not limited thereto. In some embodiments, relatively thick second conductive layers 220 and 252 are used, and then the heat dissipation structure HD does not require the additional heat dissipation substrate 900 to have sufficient heat dissipation capacity. For example, thicknesses of the second conductive layers 220 and 252 are greater than the thicknesses of the first conductive layers 120 and 140. In this embodiment, the second conductive layer 220 is thermally connected to the first chip C1 and the conductive pillar 800 through a second conductive hole 230. The bottommost second conductive layer 252 of the second redistribution structure RDL2 is thermally connected to the second conductive layer 220, and is connected to the optional heat dissipation substrate 900 through a thermally conductive material 254. The thermal conductive material 254 is, for example, a thermal interface material, solder, or other suitable materials.

In this embodiment, the pad 710 is located on the second package layer 600. The pad 710 is, for example, formed on the same film layer as the antenna structure 700. The pad 710 is electrically connected to the first redistribution structure RDL1 (for example, through other conductive vias that penetrate the first package layer 500 which are not shown in the figure), and is adapted to be connected to the circuit board 1000. For example, the circuit board 1000 is connected to the pad 710 through a conductive connecting structure 1010. The conductive connecting structure 1010 is, for example, solder, a conductive adhesive, or other suitable materials.

FIGS. 5A to 5E are schematic cross-sectional views of a manufacturing method of an integrated antenna package structure according to an embodiment of the disclosure. It is noted that some of the reference numerals and descriptions of the embodiment of FIG. 1 will apply to the embodiment of FIGS. 5A to 5E. The same reference numerals will represent the same or similar components, and the descriptions of the same technical contents will be omitted. Reference may be made to the above embodiment for the omitted descriptions, which will not be repeated in the following.

Figure 5A:
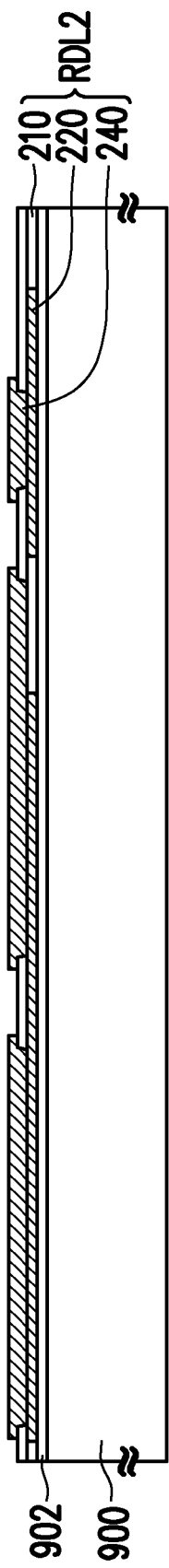
FIGS. 5A to 5E are schematic cross-sectional views of a manufacturing method of an integrated antenna package structure according to an embodiment of the disclosure.

Referring to FIG. 5A, the second redistribution structure RDL2 is formed on the heat dissipation substrate 900. In this embodiment, the buffer layer 902 is formed on the heat dissipation substrate 900 first, and then the second redistribution structure RDL2 is formed on the buffer layer 902.

Figure 5B:
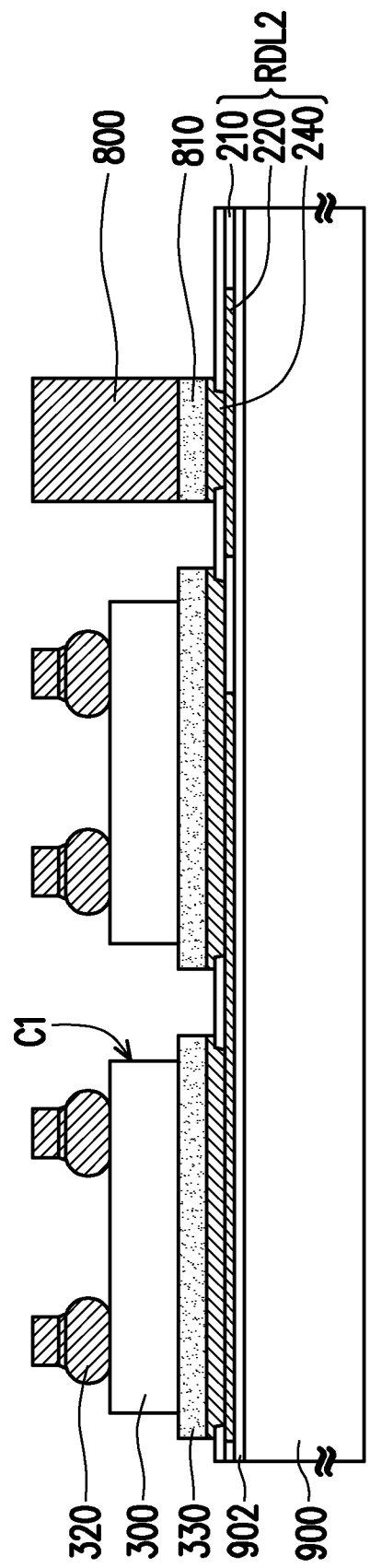

Referring to FIG. 5B, the first chip C1 and the conductive pillar 800 are placed on the second redistribution structure RDL2. The first chip C1 is connected to the second redistribution structure RDL2 through the first connecting structure 330, and the conductive pillar 800 is connected to the second redistribution structure RDL2 through the connecting structure 810.

Figure 5C:
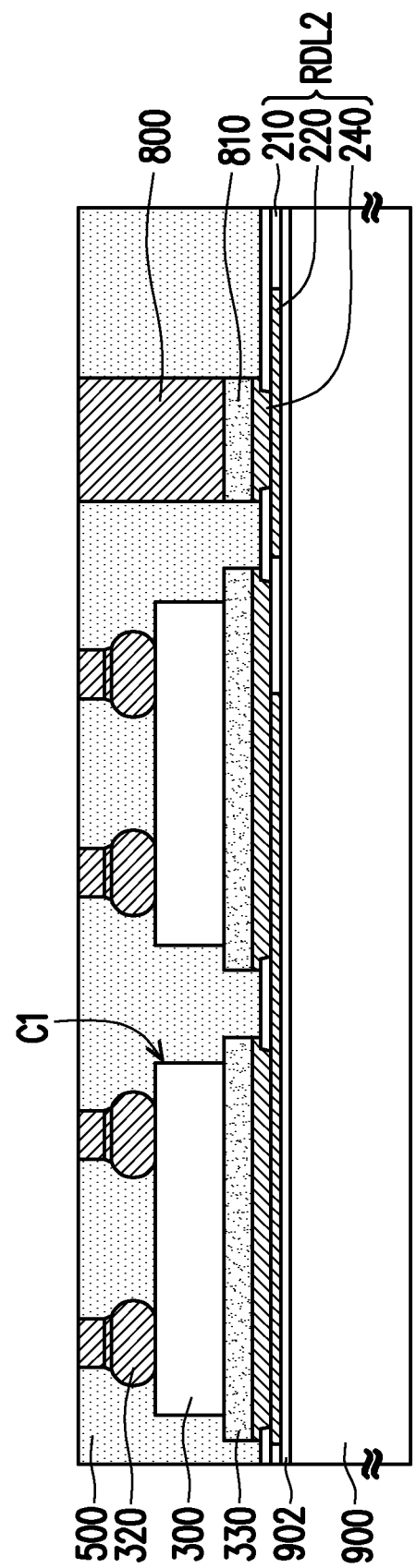

Referring to FIG. 5C, the first package layer 500 is formed on the second redistribution structure RDL2. For example, a method of forming the first package layer 500 includes the following steps. First, the package material is formed on the second redistribution structure RDL2 to cover the first chip C1 and the conductive pillar 800. Next, the foregoing package material is polished until the first connecting terminal 320 and the conductive pillar 800 of the first chip C1 are exposed. In some embodiments, when the package material is polished, the first connecting terminal 320 and the conductive pillar 800 are also partially removed during a polishing process.

Figure 5D:
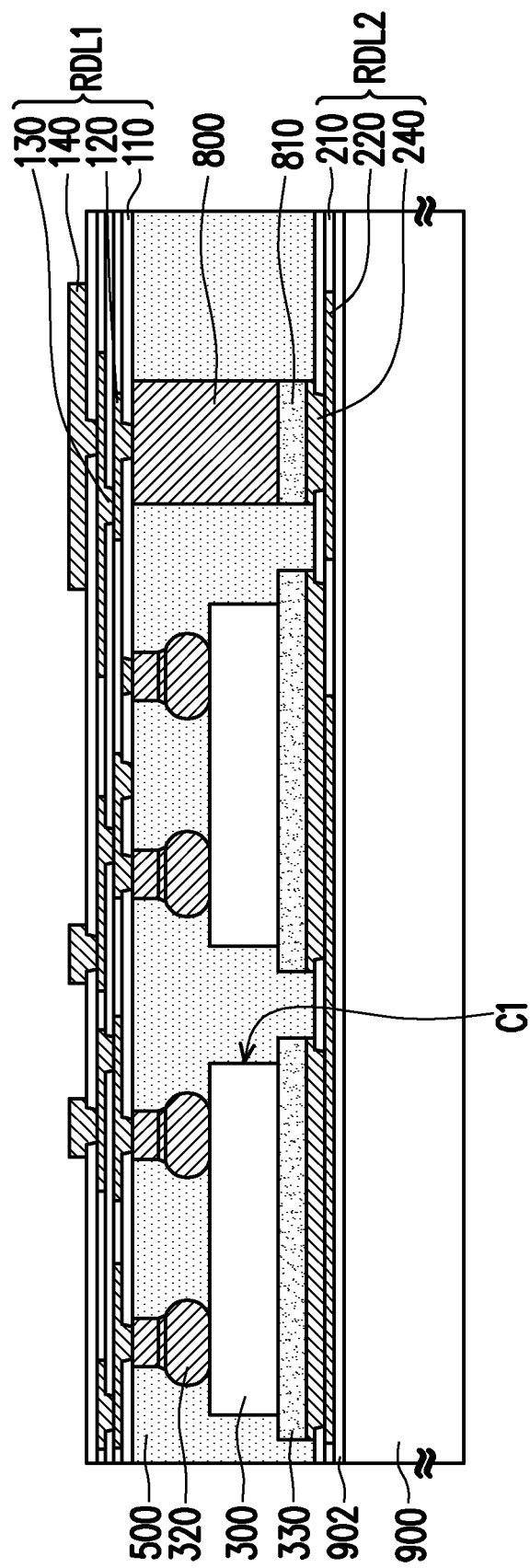

Referring to FIG. 5D, the first redistribution structure RDL1 is formed on the first package layer 500, the first chip C1, and the conductive pillar 800, and the first redistribution structure RDL1 is electrically connected to the first chip C1 and the conductive pillar 800.

Figure 5E:
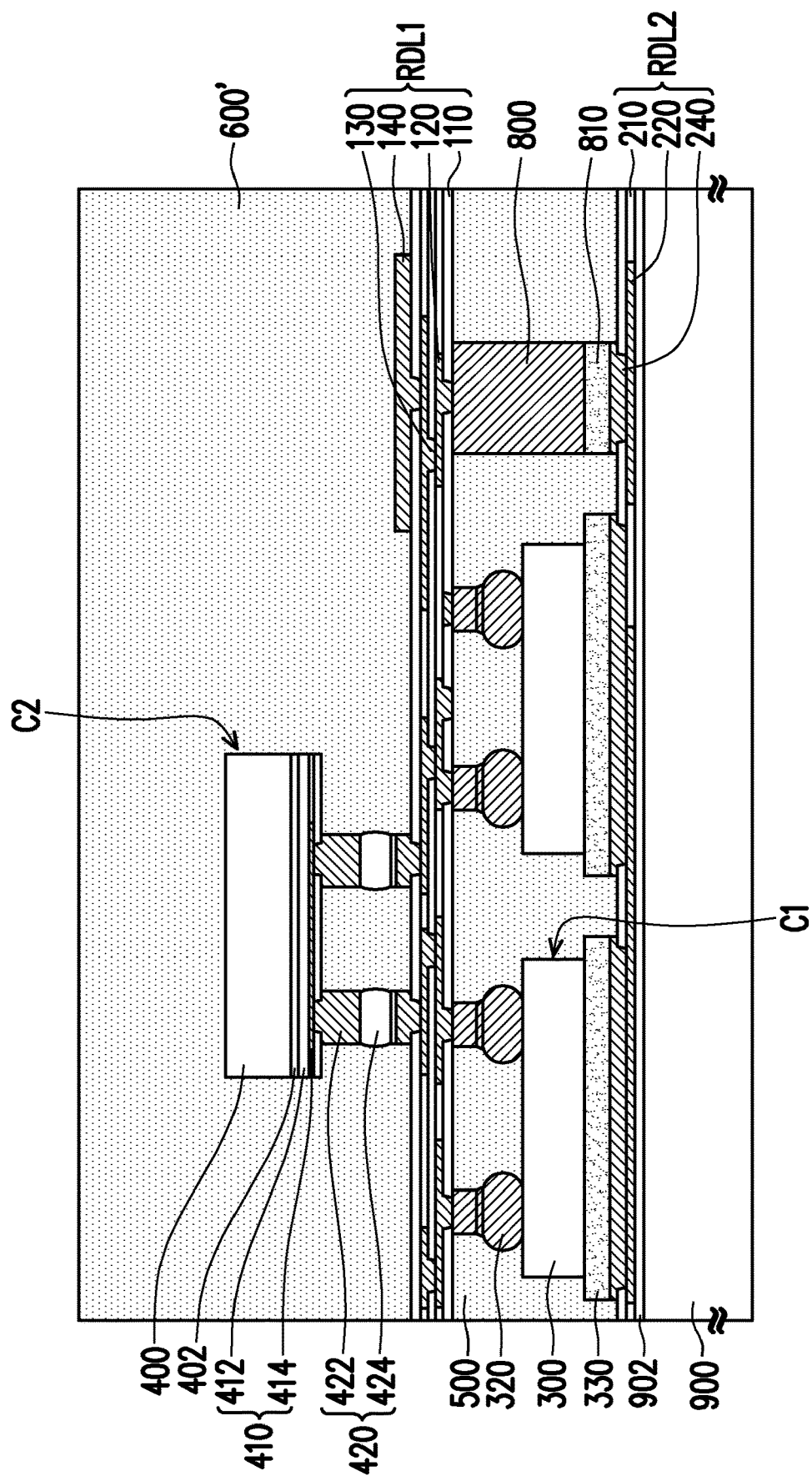

Referring to FIG. 5E, the second chip C2 is placed on the first redistribution structure RDL1. The second chip C2 is connected to the first redistribution structure RDL1 through the second connecting terminal 420. A package material 600' is formed on the first redistribution structure RDL1 to cover the second chip C2.

Next, referring to FIG. 1, a through hole is formed in the package material 600' to form the second package layer 600. The antenna structure 700 is formed on the second package layer 600, and the antenna structure 700 is electrically connected to the first redistribution structure RDL1. So far, the integrated antenna package structure 10 has been substantially completed.

FIGS. 6A to 6F are schematic cross-sectional views of a manufacturing method of an integrated antenna package structure according to an embodiment of the disclosure. It is noted that some of the reference numerals and descriptions of the embodiment of FIG. 4 will apply to the embodiment of FIGS. 6A to 6F. The same reference numerals will represent the same or similar components, and the descriptions of the same technical contents will be omitted. Reference may be made to the above embodiment for the omitted descriptions, which will not be repeated in the following.

Figure 6A:
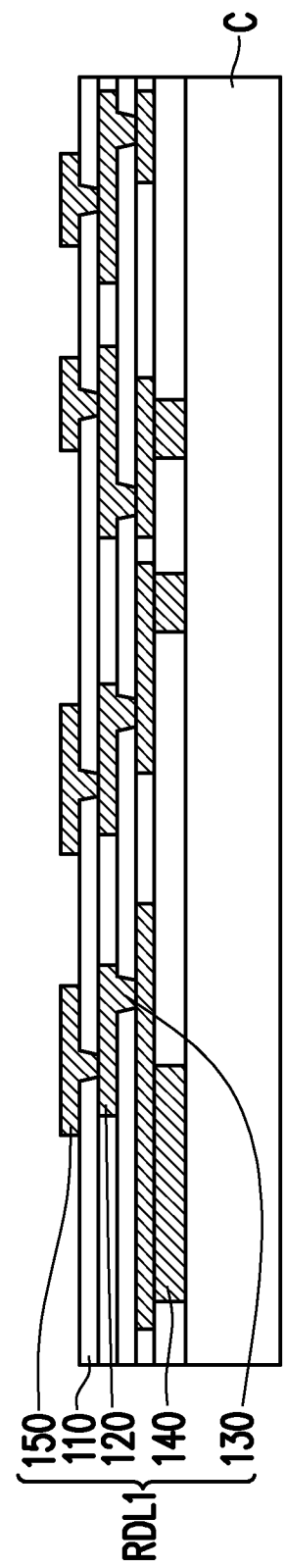
FIGS. 6A to 6F are schematic cross-sectional views of a manufacturing method of an integrated antenna package structure according to an embodiment of the disclosure.

Referring to FIG. 6A, the first redistribution structure RDL1 is formed on a carrier board C. In this embodiment, the first redistribution structure RDL1 includes the first conductive layers 120, 140, and 150 and the first insulating layers 110. The first conductive layers 120, 140, and 150 are electrically connected to one another through the first conductive hole 130.

Figure 6B:
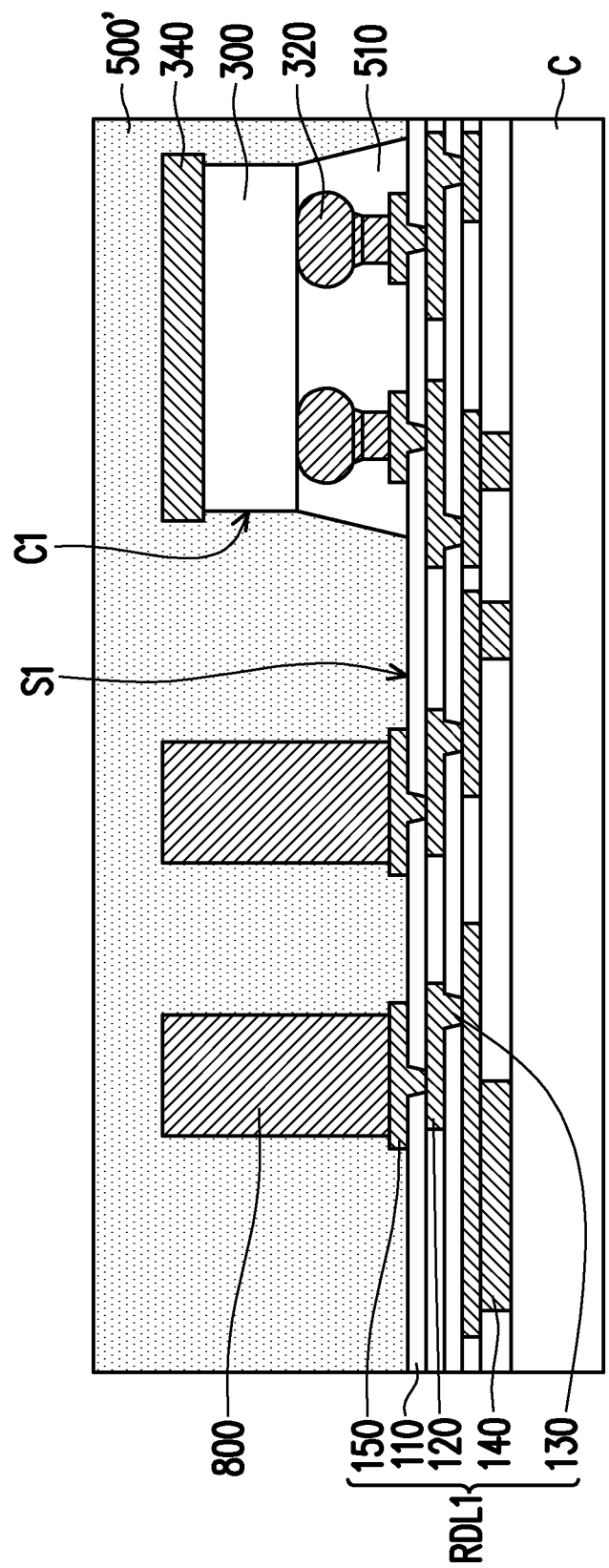

Referring to FIG. 6B, the first chip C1 and the conductive pillar 800 are placed on the first side S1 of the first redistribution structure RDL1. The first chip C1 is connected to the first conductive layer 150 of the first redistribution structure RDL1 through the first connecting terminal 320, and the conductive pillar 800 is also connected to the first conductive layer 150 of the first redistribution structure RDL1. In some embodiments, the connecting structure (such as the solder or the conductive adhesive) is further included between the conductive pillar 800 and the first conductive layer 150.

The first underfill material 510 is formed on the first side S1 of the first redistribution structure RDL1 to cover the first connecting terminal 320 of the first chip C1.

A package material 500' is formed on the first side S1 of the first redistribution structure RDL1 to cover the first underfill material 510, the first chip C1, and the conductive pillar 800.

Figure 6C:
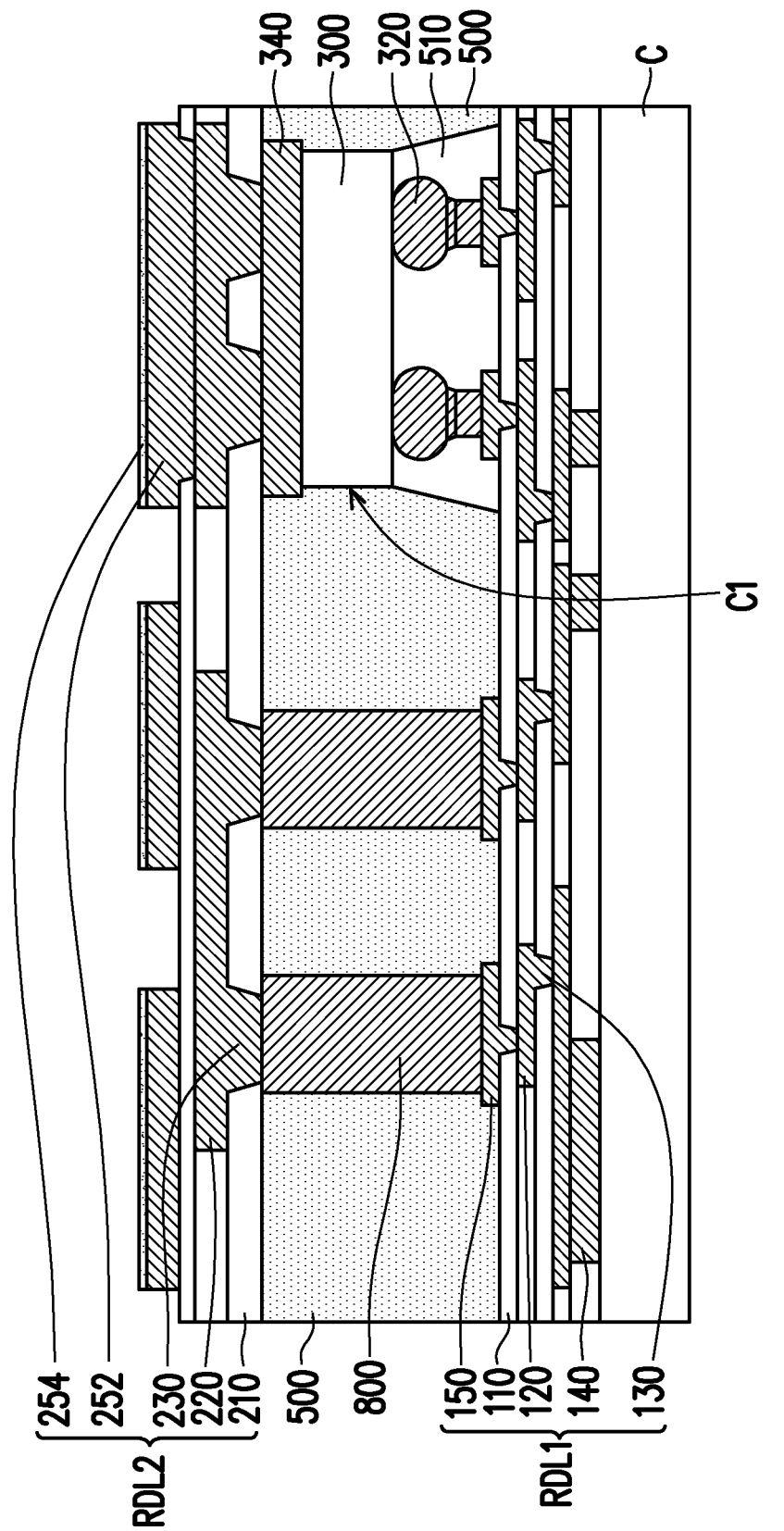

Referring to FIG. 6C, the package material 500' is polished until the heat dissipation material layer 340 and the conductive pillar 800 of the first chip C1 are exposed to form the first package layer 500. In some embodiments, the heat dissipation material layer 340 and the conductive pillar 800 are also partially removed during the polishing process.

The second redistribution structure RDL2 is formed on the first package layer 500, the heat dissipation material layer 340, and the conductive pillar 800.

Figure 6D:
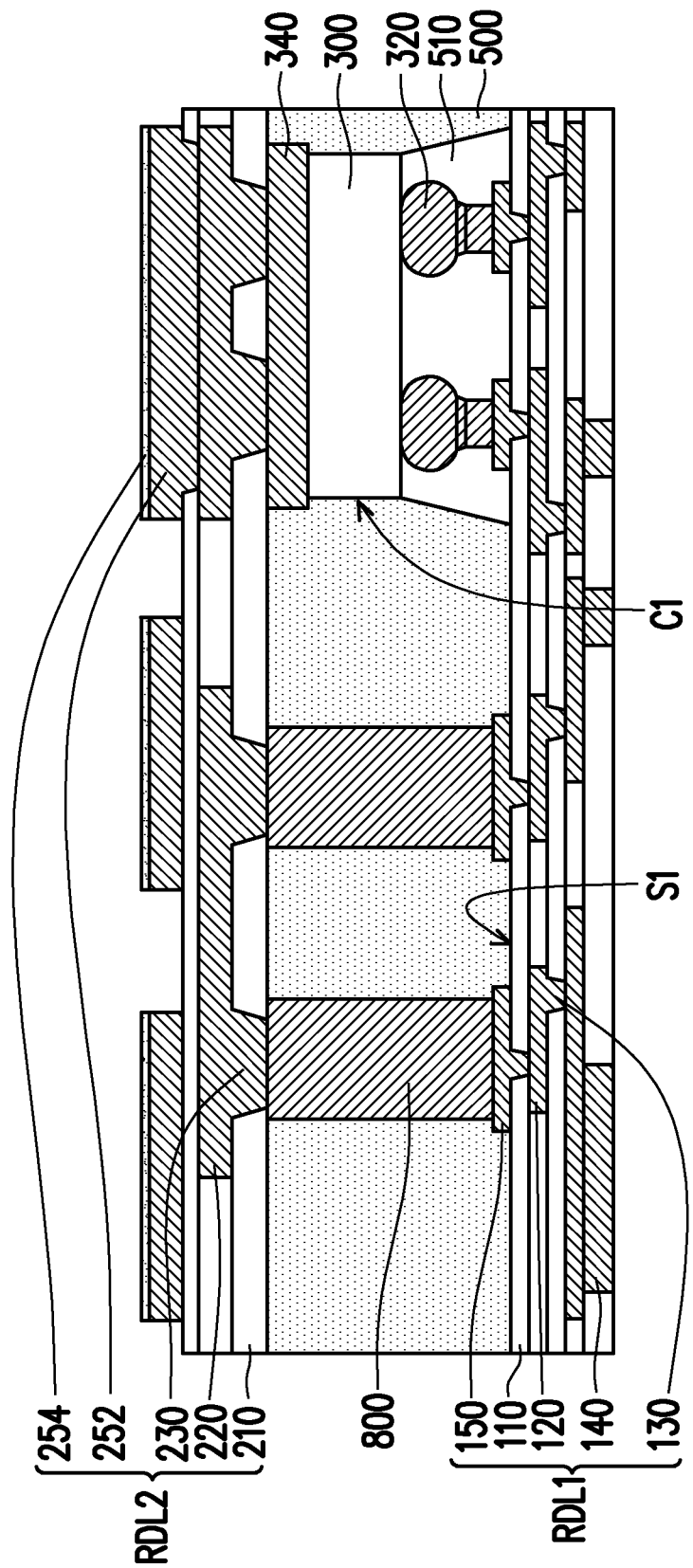

Referring to FIG. 6D, the carrier board C is removed from under the first redistribution structure RDL1.

Figure 6E:
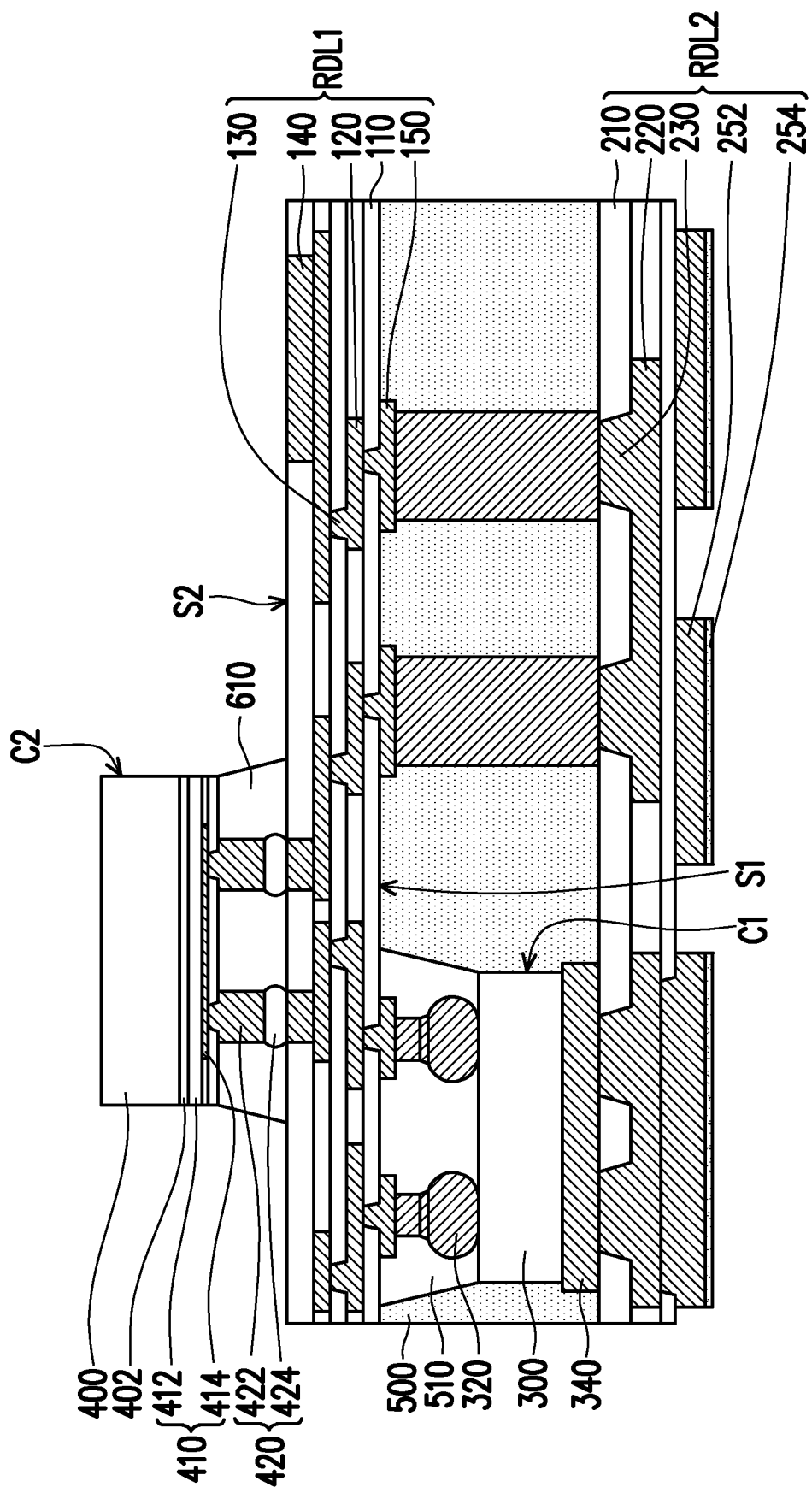

Referring to FIG. 6E, the second chip C2 is placed on the second side S2 of the first redistribution structure RDL1. The second chip C2 is connected to the first conductive layer 140 of the first redistribution structure RDL1 through the second connecting terminal 420.

The second underfill material 610 is formed on the second side S2 of the first redistribution structure RDL1 to cover the second connecting terminal 420 of the second chip C2.

Figure 6F:
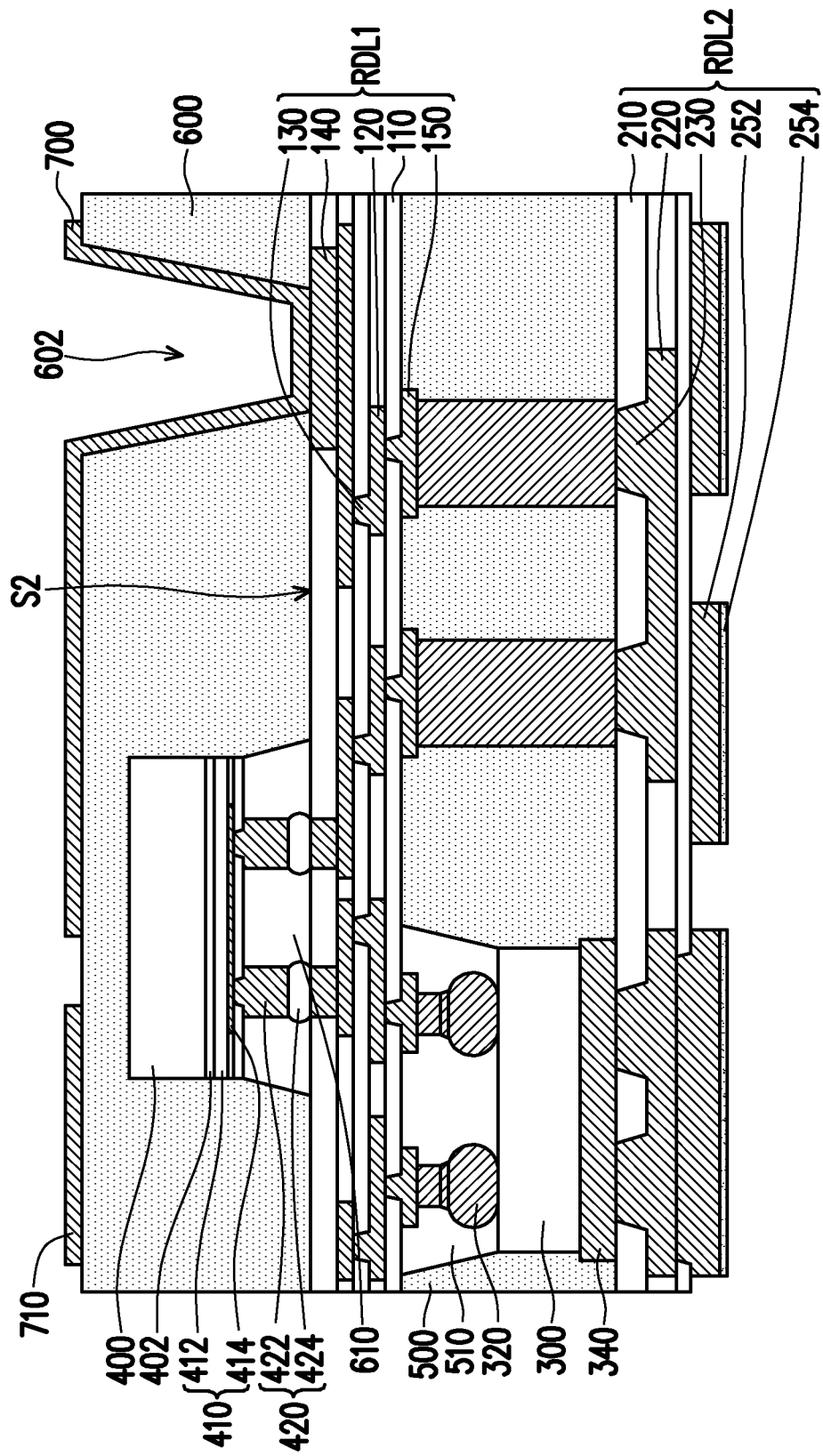

Referring to FIG. 6F, the second package layer 600 is formed on the second side S2 of the first redistribution structure RDL1. For example, a method of forming the second package layer 600 includes the following steps. First, the package material is formed on the first redistribution structure RDL1 to cover the second underfill material 610 and the second chip C2. Then, a through hole exposing the first redistribution RDL1 is formed in the foregoing package material.

Next, the antenna structure 700 and the pad 710 are formed on the second package layer 600. The antenna structure 700 and the pad 710 are, for example, formed at the same time, and the antenna structure 700 and the pad 710 are electrically connected to the first redistribution structure RDL1.

Referring to FIG. 4, the circuit board 1000 is connected to the pad 710. The heat dissipation substrate 900 is selectively connected to the second redistribution structure RDL2. So far, the integrated antenna package structure 40 has been substantially completed.

Based on the above, the first chip and second chip are respectively located on the first side and second side of the first redistribution structure. Therefore, the circuit layout space of the integrated antenna package structure may be used more effectively, so that the integrated antenna package structure may integrate a larger number of chips. In addition, the heat dissipation structure thermally connected to the first chip may effectively improve the heat dissipation efficiency of the integrated antenna package structure.

What is claimed is:

1. An integrated antenna package structure, comprising:
   a first redistribution structure comprising a plurality of first conductive layers and a plurality of first insulating layers overlapping the plurality of first conductive layers;
   a first chip located on a first side of the first redistribution structure and electrically connected to the first redistribution structure;
   a heat dissipation structure thermally connected to the first chip, wherein the first chip is located between the heat dissipation structure and the first redistribution structure;
   a second chip located on a second side of the first redistribution structure opposite to the first side and electrically connected to the first redistribution structure, wherein one of the plurality of first conductive layers is located between the first chip and the second chip; and
   an antenna structure electrically connected to the first redistribution structure, wherein the antenna structure extends continuously to contact a top surface of the one of the plurality of first conductive layers.

2. The integrated antenna package structure according to claim 1, further comprising:
   a first package layer surrounding the first chip; and
   a second package layer surrounding the second chip, wherein the first package layer and the second package layer are respectively located on the first side and the second side of the first redistribution structure.

3. The integrated antenna package structure according to claim 2, wherein the antenna structure is formed on a top surface of the second package layer, and continuously extends from the top surface of the second package layer into a via in the second package layer to form a conductive via that contacts the one of the plurality of first conductive layers.

4. The integrated antenna package structure according to claim 1, wherein the heat dissipation structure includes a second redistribution structure, and the first chip is located between the second redistribution structure and the first redistribution structure.

5. The integrated antenna package structure according to claim 4, further comprising:
   a first package layer surrounding the first chip; and
   a conductive pillar, wherein the first package layer surrounds the conductive pillar, and the conductive pillar electrically connects the second redistribution structure to the first redistribution structure.

6. The integrated antenna package structure according to claim 4, wherein the second redistribution structure comprises at least one second conductive layer and at least one second insulating layer overlapping the at least one second conductive layer, wherein a thickness of the at least one second conductive layer is greater than a thickness of the plurality of first conductive layers.

7. The integrated antenna package structure according to claim 4, wherein the heat dissipation structure further comprises:
   a heat dissipation substrate thermally connected to the second redistribution structure.

8. The integrated antenna package structure according to claim 1, wherein
   the first chip comprises:
     a first semiconductor structure; and
     a plurality of first connecting terminals electrically connecting the first semiconductor structure to the first redistribution structure, and
   the second chip comprises:
     a second semiconductor structure; and
     a plurality of second connecting terminals electrically connecting the second semiconductor structure to the first redistribution structure, wherein the plurality of first connecting terminals the plurality of second connecting terminals are respectively connected to the first side and the second side of the first redistribution structure.

9. The integrated antenna package structure according to claim 1, wherein the antenna structure is directly formed on the first redistribution structure, and a top surface of the antenna structure is closer to the first redistribution structure than a top surface of the second chip.

10. An integrated antenna package structure, comprising:
    a first chip and a second chip;
    a first redistribution structure located between the first chip and the second chip, wherein the first redistribution structure comprises a plurality of first conductive layers and a plurality of first insulating layers overlapping the plurality of first conductive layers, wherein one of the plurality of first conductive layers is located between the first chip and the second chip;
    a first package layer surrounding the first chip;
    a heat dissipation structure located under the first chip and the first package layer and thermally connected to the first chip; and
    an antenna structure electrically connected to the first redistribution structure, wherein the antenna structure extends continuously to contact the top surface of the one of the plurality of first conductive layers.

11. The integrated antenna package structure according to claim 10, further comprising:
    a second package layer surrounding the second chip, wherein the first package layer and the second package layer are respectively located on two opposite sides of the first redistribution structure.

12. The integrated antenna package structure according to claim 11, wherein the antenna structure is formed on a top surface of the second package layer, and continuously extends from the top surface of the second package layer into a via in the second package layer to form a conductive via that contacts the one of the plurality of first conductive layers.

13. The integrated antenna package structure according to claim 10, wherein the heat dissipation structure includes a second redistribution structure, and the first chip is located between the second redistribution structure and the first redistribution structure.

14. The integrated antenna package structure according to claim 13, further comprising:
a conductive pillar, wherein the first package layer surrounds the conductive pillar, and the conductive pillar electrically connects the second redistribution structure to the first redistribution structure.

15. The integrated antenna package structure according to claim 13, wherein the second redistribution structure comprises at least one second conductive layer and at least one second insulating layer overlapping the at least one second conductive layer, wherein a thickness of the at least one second conductive layer is greater than a thickness of the plurality of first conductive layers.

16. The integrated antenna package structure according to claim 13, wherein the heat dissipation structure further comprises:
a heat dissipation substrate thermally connected to the second redistribution structure.

17. The integrated antenna package structure according to claim 10, wherein the first chip comprises:
a first semiconductor structure; and
a plurality of first connecting terminals electrically connecting the first semiconductor structure to the first redistribution structure, and the second chip comprises:
a second semiconductor structure; and
a plurality of second connecting terminals electrically connecting the second semiconductor structure to the first redistribution structure, wherein the plurality of first connecting terminals and the plurality of second connecting terminals are respectively connected to a first side and a second side of the first redistribution structure.

18. The integrated antenna package structure according to claim 10, wherein the antenna structure is directly formed on the first redistribution structure, and a top surface of the antenna structure is closer to the first redistribution structure than a top surface of the second chip.

* * * * *